(12) United States Patent
Wagner

(10) Patent No.: US 7,206,142 B1
(45) Date of Patent: Apr. 17, 2007

(54) REFRACTIVE SPECTRUM SPLITTING CONCENTRATOR SYSTEM

(76) Inventor: Donald J. Wagner, 16995 Kennedy Rd., Los Gatos, CA (US) 95032

( * ) Notice: Subject to any disclaimer, the term of this patent is extended or adjusted under 35 U.S.C. 154(b) by 0 days.

(21) Appl. No.: 11/029,578

(22) Filed: Jan. 5, 2005

(51) Int. Cl.
*G02B 3/08* (2006.01)
(52) U.S. Cl. .................................... 359/742; 359/741
(58) Field of Classification Search ......... 359/741–743
See application file for complete search history.

(56) References Cited

U.S. PATENT DOCUMENTS

| | | |
|---|---|---|
| 6,015,950 A | 1/2000 | Converse |
| 6,399,874 B1 | 6/2002 | Olah |
| 2004/0085641 A1* | 5/2004 | Yun et al. .................. 359/565 |

OTHER PUBLICATIONS

Nick Mardisich and Virgil Shields, Advanced Rainbow Solar Photovoltaic Arrays at http://www.nasatech.com/Briefs/June03/NPO21051.html.

* cited by examiner

*Primary Examiner*—Ricky Mack
*Assistant Examiner*—Jack Dinh
(74) *Attorney, Agent, or Firm*—Schein & Cai LLP; Douglas E. Mackenzie

(57) ABSTRACT

A single lens for concentrating and refracting electromagnetic energy having a broad energy spectrum onto bands of a target device includes a lens having a flat top side and a plurality of regions, each region refracting the electromagnetic energy and concentrating specific wavelengths onto specific bands of the target device. A focusing detector is also provided.

5 Claims, 4 Drawing Sheets

REFRACTIVE SPECTRUM SPLITTING
CONCENTRATOR SYSTEM

BACKGROUND OF INVENTION

1. Field of the Invention

This invention relates to solar energy conversion systems, and more particularly to a solar energy conversion system having improved efficiency achieved by concentrating and refracting electromagnetic radiation incident on a flat array of adjacent lenses.

2. Description of the Prior Art

It is well know in the art to convert solar energy to electricity using semiconductor photovoltaic cells. To improve efficiency of conversion, optical concentrators may be employed to increase the intensity or brightness of the sunlight that strikes the photovoltaic cell. Furthermore, the broad solar spectrum may be separated into photons having different energies and directed to appropriate photovoltaic cells having suitable band gaps.

A solar energy converter is disclosed in U.S. Pat. No. 2,949,498 to Jackson (1960) that splits the solar spectrum by stacking photovoltaic cells. A high band gap photovoltaic cell is placed in front of one or more photovoltaic cells having successively lower band gaps. High energy photons are absorbed by the first cell and lower energy photons are absorbed by the following cell. This method is disadvantageous in that the leading cells interfere with the following cells.

Borden et. al., Proceedings of the Fifteenth IEEE Photovoltaic Specialists Conference, pp. 311–316 (1981), describes a design in which light is incident upon a dichroic filter that transmits high energy photons to a high band gap photovoltaic cell and reflects low energy photons to a low band gap cell. This method is disadvantageous in that a single dichroic filter yields only two spectral components, and an additional dichroic filter is needed for each additional desired spectral component.

Ludman et al., Proceedings of the Twenty-fourth IEEE Photovoltaic Specialists Conference, pp. 1208–1211 (1994), describes a design in which the spectrum is split by diffraction, and different photovoltaic cells are arranged to capture light of different wavelengths. A hologram serves as the diffraction grating and also concentrates the sunlight. This method is disadvantageous in that it is difficult to economically create durable diffraction gratings having high optical efficiency over a wide portion of the solar spectrum.

While refractive dispersion is a well known means of separating light into its spectral components, it is not trivial to create a refractive optical arrangement that is suitable for solar energy conversion. For example, refractive dispersion designs using only a single array of prisms or a concentrator with a single dispersing prism at or near its focus do\not simultaneously provide adequate dispersion and concentration. U.S. Pat. No. 4,021,267 to Dettling discloses a spectrum splitting arrangement comprising concentrating, collimating, and refractive dispersing means. This method is disadvantageous in that the collimating optical element introduces additional transmission losses and alignment difficulties.

In U.S. Pat. No. 6,015,950 to Converse (1997), a "Refractive Spectrum Splitting Photovoltaic Concentrator System", the system uses two optical elements and does no have auto-focusing bands on the solar cells. Sunlight passes sequentially through two separated arrays of refracting elements which direct photons in different energy bands to appropriate solar energy converters, such as semiconductor photovoltaic cells having suitable band gaps.

A solar concentrator utilizing a primary optical concentrator is disclosed in U.S. Pat. No. 6,399,874 to Olah (2002). A Fresnel lens has a predetermined focal distance and the photovoltaic cell is supported within a housing within the focal range of the lens and at a distance from the lens that is less than the focal distance.

A rainbow type of photovoltaic array equipped with light-concentrator and spectral beam splitter optics is disclosed in "Advanced Rainbow Solar Photovoltaic Arrays" available from NASA's Jet Propulsion Laboratory at www-.nasatech.com/briefs/june03/NP021051.html. The rainbow photovoltaic array comprises side-by-side strings of series-connected photovoltaic cells. The cells in each string have the same band gap, which differs from the band gaps of the other strings. To obtain maximum energy conversion efficiency and to minimize the size and weight of the array for a given sunlight input aperture, the sunlight incident on the aperture is concentrated, then spectrally dispersed onto the photovoltaic-array plane, whereon each string of cells is positioned to intercept the light in its wavelength band of most efficient operation. A proposed unitary concentrator/spectral-beam-splitter optic includes a parabolic curved Fresnel-like prism array with panels of photovoltaic cells on two sides. A surface supporting the solar cells can be adjusted in length or angle to accommodate the incident spectral pattern. The proposed concentrator/spectral-beam-splitter optic suffers the disadvantage of being hard to focus, and costly to build versus a single flat lens.

Notwithstanding the known problems and attempts to solve these problems, the art has not adequately responded to date with the introduction of a solar energy conversion system which improves efficiency by concentrating and splitting the solar energy spectrum with a system that is simple, efficient and affordable.

SUMMARY OF THE INVENTION

In accordance with one aspect of the invention, a refractive spectrum splitting concentrator system includes a unitary flat lens which may be employed to concentrate and focus electromagnetic waves. The unitary flat lens may be used for solar applications as well as for other applications such as detection of specific wavelengths and detection of different levels of specific wavelengths.

The system may also use auto-focusing bands built into or on a target element and may be used in conjunction with the target element. The auto-focusing bands may also be used in an application with a different type of lens.

In accordance with another aspect of the invention, a single lens for concentrating and refracting electromagnetic energy having a broad energy spectrum onto bands of a target device includes a lens having a flat top side and a plurality of regions, each region refracting the electromagnetic energy and concentrating specific wavelengths onto specific bands of the target device.

In accordance with yet another aspect of the invention, a system for concentrating and refracting electromagnetic energy having a broad energy spectrum onto bands of a target device includes a lens having a flat top side and a plurality of regions, each region refracting the electromagnetic energy and concentrating specific wavelengths onto specific bands of the target device, and a focusing detector, the focusing detector operable to detect a condition were the concentrated specific wavelengths are in an in focus/out of focus condition relative to the specific bands of the target device.

In accordance with still another aspect of the invention, an apparatus for concentrating and refracting electromagnetic energy having a broad energy spectrum onto bands of a target device includes a single Fresnel lens having a flat top side and a plurality of regions having a same glass angle, each region refracting the electromagnetic energy and concentrating specific wavelengths onto specific bands of the target device, and a focusing detector, the focusing detector operable to detect a condition were the concentrated specific wavelengths are in an in focus/out of focus condition relative to the specific bands of the target device by comparing a first set of concentrated specific wavelengths in a first band of the target device with a second set of concentrated specific wavelengths in a second band of the target device and determining that the first set of concentrated specific wavelengths is out of focus relative to the first band of the target device.

There has been outlined, rather broadly, the more important features of the invention in order that the detailed description thereof that follows may be better understood, and in order that the present contribution to the art may be better appreciated. There are additional features of the invention that will be described below and which will form the subject matter of the claims appended herein.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. It is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF THE INVENTION

Figure 1:
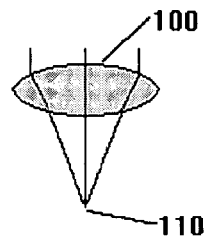
FIG. 1 is a cross sectional view of a prior art magnifying glass.
Figure 2:
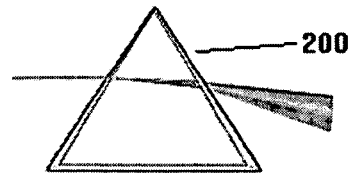
FIG. 2 is a cross sectional view of a prior art prism.
Figure 3:
FIG. 3 is a cross sectional view of a prior art Fresnel magnifying glass.
Figure 4:
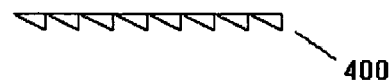
FIG. 4 is a cross sectional view of a prior art Fresnel prism.

The present invention comprises a refractive spectrum splitting concentrator system including a unitary lens which may be employed to concentrate and focus electromagnetic waves. By way of background, a magnifying glass 100 (FIG. 1) may be employed to focus parallel light at a point 110. A prism 200 (FIG. 2) may be employed to refract light. A Fresnel magnifying glass 300 and a Fresnel prism 400 are shown in FIG. 3 and FIG. 4 respectively.

Figure 5:
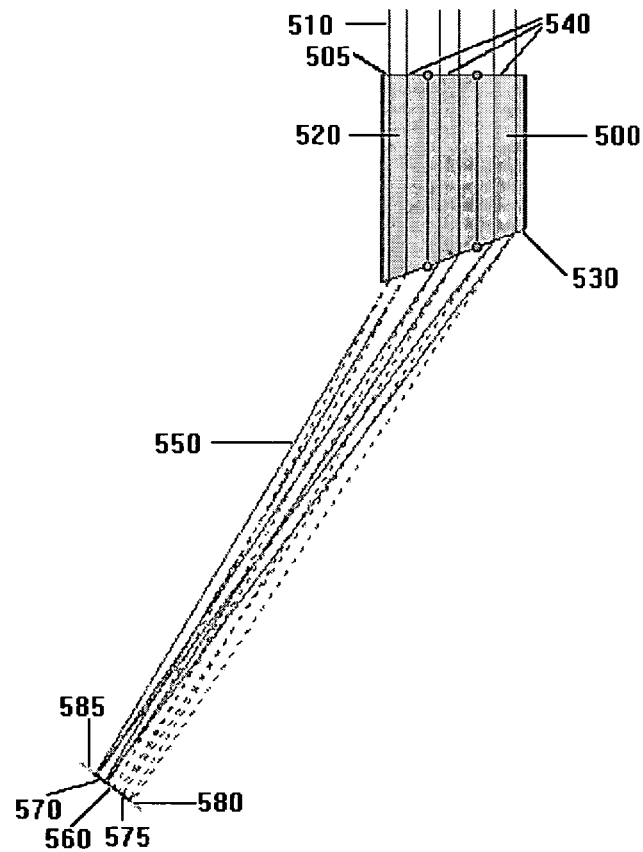
FIG. 5 is a cross sectional view of a flat concentrating refracting lens in accordance with the invention.

Wavelengths of electromagnetic energy may be refracted and concentrated by using a concentrating refracting lens 500 in accordance with the invention and as shown in FIG. 5. For example, incident sunlight 510 may enter a flat top side 505 of the concentrating refracting lens 500 at an angle such that incident rays will have minimal reflection. As shown in FIG. 5, the angle is 90°, and will typically be 80° to 100°. The incident rays may be refracted in the concentrating refracting lens 500 and travel through a glass or other medium 520 that is transparent to certain wavelengths. The refracted wavelengths then exit the concentrating refracting lens 500 through a non-flat edge 530. The refracted light 550 may then be concentrated at a target device 560 including a solar cell. The target device 560 may have multiple target areas to maximize the efficiency of the target device 560. For example, target device 560 may have four target areas; blue 570, red 575, wavelengths above red 580 and wavelengths below blue 585.

The concentrating refracting lens 500 may be divided into a plurality of different regions 540. Each region 540 may have the same angle at the edge 530 throughout that region 540. Different regions 540 may have a different angle, which may focus the wavelengths onto the target device 560. In the FIG. 5 there are shown five such regions, but one skilled in art will appreciate that there could be many more, which could focus and refract the light of other wavelengths. This is a means for concentration and refraction with only one lens.

Figure 6:
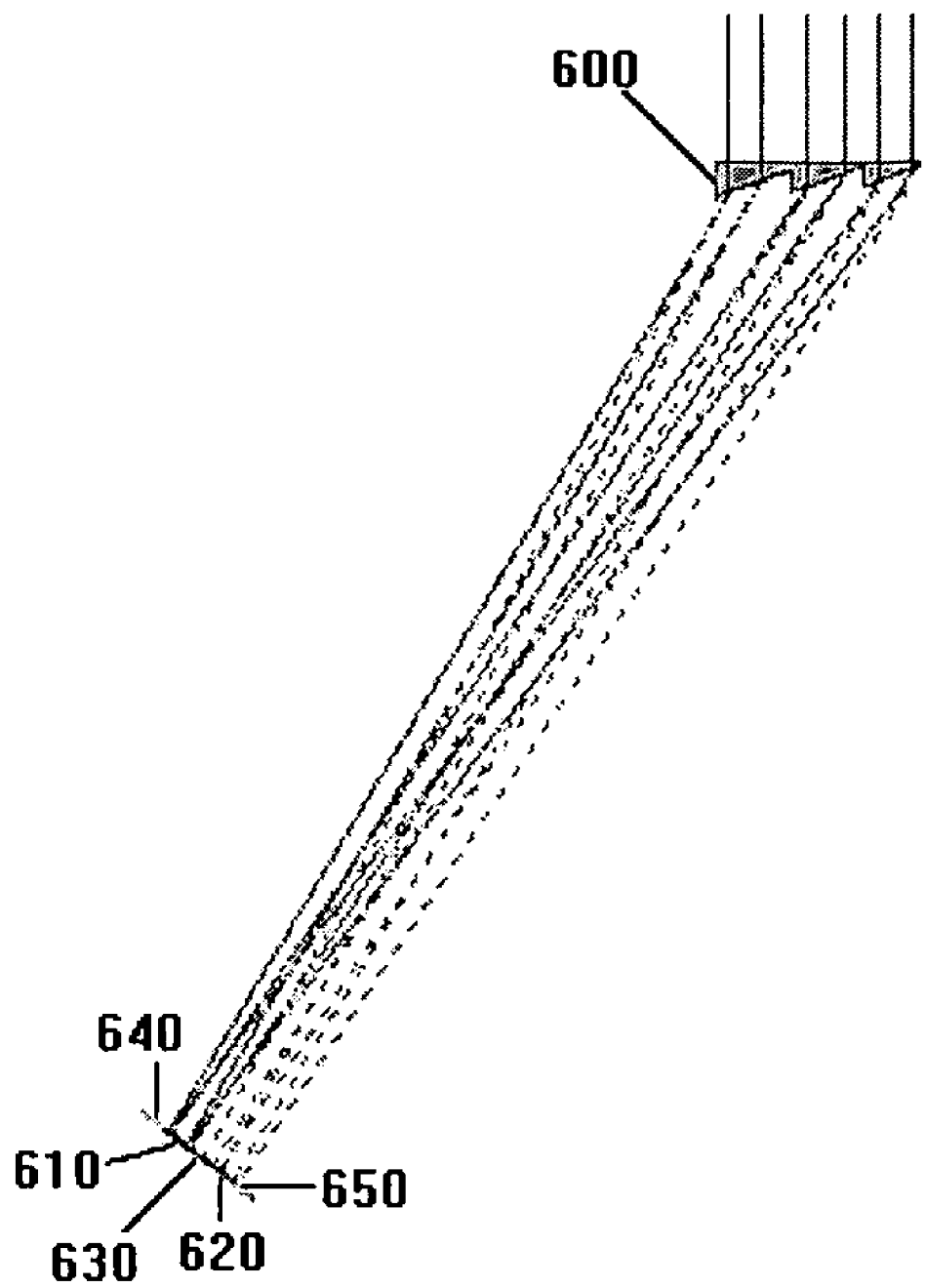
FIG. 6 is a cross sectional view of a flat concentrating refracting Fresnel lens in accordance with the invention.

With reference to FIG. 6, a Fresnel lens 600 may be employed to achieve the purposes of the invention. The Fresnel lens 600 may focus all the red and blue light onto a target device 610 such as a solar cell that efficiently handles blue and wavelengths. Part of the light may be focused on a part of the target device 620 that handles blue wavelengths and another part of the light on part of the target device 630 that handles red wavelengths. Note that other wavelengths could be used with the lower wavelengths being focused past the blue wavelengths in an area 640 and wavelengths higher than red being focused past the red wavelengths in an area 650. Note that the target device 610 may not necessarily be parallel to an outside edge 605 of the Fresnel lens 600, but will typically be approximately perpendicular to the light being focused on the target device 610.

Figure 7:
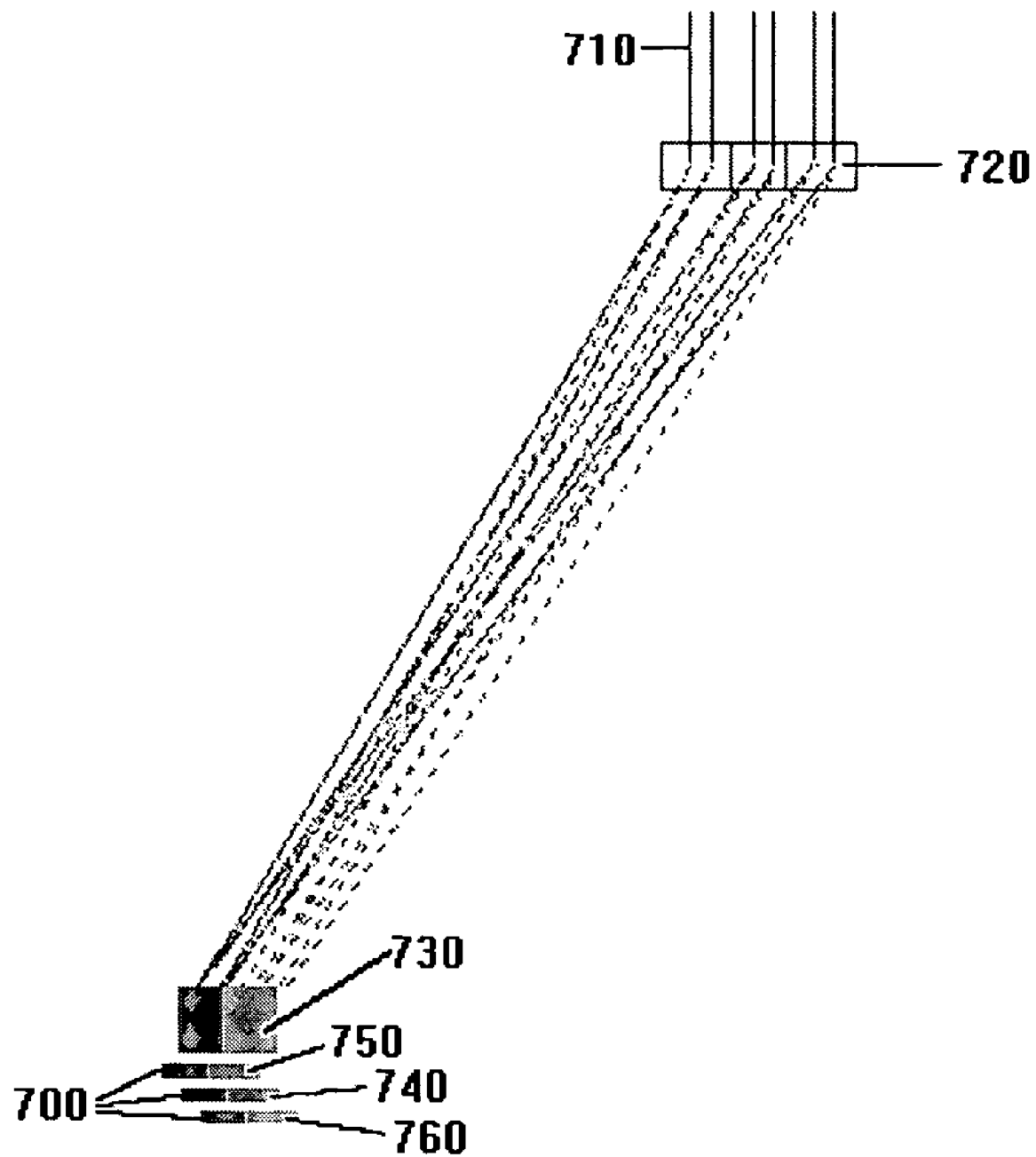
FIG. 7 is schematic representation of auto-focusing bands in accordance with the invention.

Since the angle at which the refracted light impinges upon the target device 610 is critical for maximum efficiency and a slight difference in the angle would make a big difference in the concentration of the refracted rays a detector 700 utilizing the difference in the angle may be provided as shown in FIG. 7. Electromagnetic radiation 710 may enter a concentrating refracting lens 720 and be refracted and concentrated onto a target element 730. The refracted and concentrated rays may be in phase, as in band 740 and out of phase as in bands 750 and 760 with the target element 730. Detector 700 may be operable to determine if a system including the concentrating refracting lens 720 and the target element 730 is optimally focused by comparing the appropriate wavelengths for band 740 with the appropriate wavelengths for band 750 and the appropriate wavelengths for band 740 with the appropriate wavelengths for band 760. If band 740 has a higher concentration of the appropriate wavelengths, then the system is in focus. If bands 750 or 760 have a higher concentration of the appropriate wavelengths, then the system needs to move to get refocused. As shown in FIG. 7, the blue and red light is in focus for band 760 and out of focus for band 740. For optimal efficiency, the system may be moved to get refocused. Focusing bands 740, 750, and 760 may be on the target element 730 or apart from the target element 730.

Figure 8:
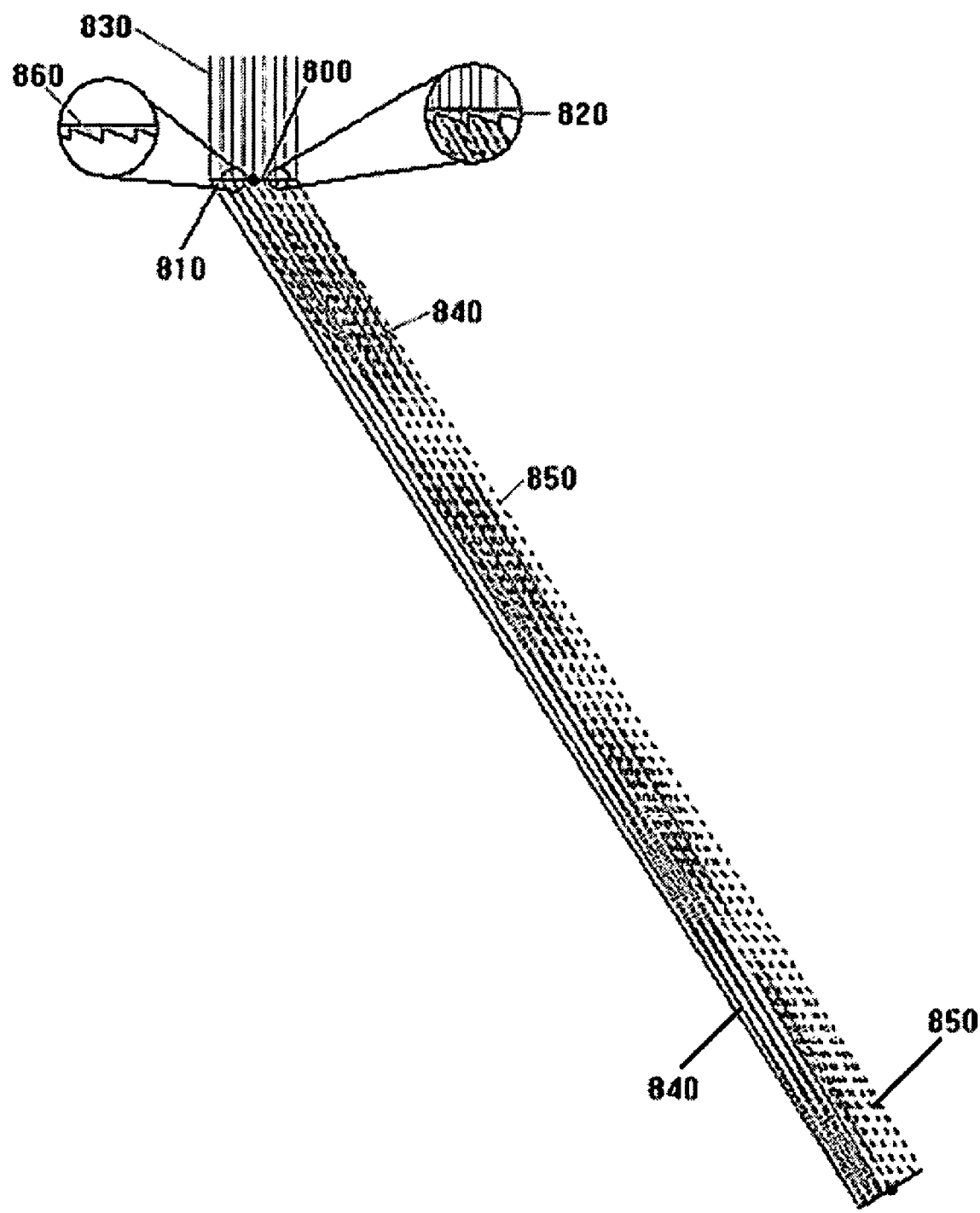
FIG. 8 is an illustration showing a flat concentrating refracting lens and associated computations in accordance with the invention.

A diagram illustrating the principles of the invention is shown in FIG. 8. A concentrating refracting lens 800 is shown including three regions DG, GI and IK with each region having the same angle. A region DG may have a glass angle ABC of 31.09° yielding line angles of 68.03° and 70.71° for concentrating Red_656 (red light) and Blue_486 (blue light) on a target EF of 0.354 cm. Note that any incoming blue light 810 perpendicular to DG will pass through the line LE and any red light perpendicular to DG will pass through the line LF. To compute the second glass angle, blue light starting at point G must be refracted so it will pass through point E. This yields a line angle of 73.08° and a glass angle of 31.56°. The glass angle of 31.56° causes red light to be refracted at 70.05°. To determine how large the region GI should be, a line parallel to EG going through L and intersecting the outer edge 820 of the Fresnel lens is drawn.

Similar steps may be used to get the angle for the blue light for the region IK of 74.65° with a glass angle of 31.84° and a red light angle of 71.34°. Note that this embodiment could be different in many respects in that it could have a medium other than glass that refracts the electromagnetic spectrum. The incoming angle of the light could be at an angle besides 90° although it will typically be between 80° and 100°. FIG. 8 also shows the target area EF to be perpendicular to line GL. This is not always the case.

The preferred embodiment of the present invention may be modified in a number of ways without departing from the object of the invention. The number, size, shape, relative position, and composition of the concentrating refracting lens and target element may be varied. Moreover, known techniques from the field of solar energy conversion may be applied in realizing the invention. For example, refracting or reflecting optical elements may be placed near the regions of focus to provide additional concentration, and photovoltaic cells may be stacked. Embodiments of the invention may include solar energy converters other than solar cells that also benefit from spectrum splitting, such as photo-electrochemical cells, and thermal cogeneration arrangements in which fluids are heated. The target element may also include an electromagnetic detector, which can determine if there are enough electromagnetic waves of a specific frequency to trigger the device to a specific level In addition to solar energy conversion, the present invention is of value for measurement of the spectral composition of electromagnetic radiation by placing detection means at the regions of focus. Additionally, the present invention may be used for educational demonstrations or decorative display by making the regions of focus visible to an observer.

The present invention is generally advantageous for solar application in that concentration permits the use of a smaller quantity of relatively costly photovoltaic cells, and spectrum splitting allows those cells to operate at higher efficiency. The concentrating refracting lens can be economically manufactured of durable materials using methods known from Fresnel lens manufacture, although may be produced using other methods.

In comparison to splitting the solar spectrum by stacking photovoltaic cells, the present invention is advantageous in that different parts of the photovoltaic cells may be optimized for specific wavelengths reducing the heat and increasing the efficiency.

In comparison to splitting with a dichromatic filter, the present invention is advantageous in that the number of photovoltaic cells is not limited by the optical arrangement. In comparison to splitting by diffraction, the present invention is advantageous in that a concentrated and refracted portion of the solar spectrum may be practically directed to the photovoltaic cells. In comparison to spitting by concentrating, collimating, and then dispersing sunlight, the present invention is advantageous in that fewer optical elements are required allowing for a less costly and more efficient system. The incoming angle of the separated light is critical to the efficiency. If the concentrating refracting lens is in focus, then there will be a high concentration of electromagnetic waves at a specific area on the target device.

The system may take advantage of this by incorporating auto-focusing bands that take advantage of the concentration or lack of concentration of a specific wavelength at a specific band on the target element, or in conjunction with the target element. If the system is not in focus, then either the concentrating refracting lens or the target element may move to regain maximum focus. The auto-focusing bans may also potentially be used with a device other then the concentrating refracting lens.

Wavelengths of electromagnetic energy may be refracted and concentrated by using a concentrating refracting lens 500 in accordance with the invention and as shown in FIG. 5. For example, incident sunlight 510 may enter a flat side 505 of the concentrating refracting lens 500 at an angle such that incident rays will have minimal reflection. As shown in FIG. 5, the angle is 90°, and will typically be 80° to 100°. The incident rays may be refracted in the concentrating refracting lens 500 and travel through a glass or other medium 520 that is transparent to certain wavelengths. The refracted wavelengths then exit the concentrating refracting lens 500 through a non-flat edge 530. The refracted light 550 may then be concentrated at a target device 560 including a solar cell. The target device 560 may have multiple target areas to maximize the efficiency of the target device 560. For example, target device 560 may have four target areas; blue 570, red 575, wavelengths above red 580 and wavelengths below blue 585.

The concentrating refracting lens 500 may be divided into a plurality of different lens regions 540. Each lens region 540 may have the same angle at the edge 530 throughout that region 540. Different lens regions 540 may have a different angle, which will focus the wavelengths onto the target device 560. In the FIG. 5 there are shown three lens regions 540. One skilled in art will appreciate that there could be any number of lens regions 540 and target areas of the target 560. The concentrating refracting lens 500 thereby provides a means for concentration and refraction using only one lens.

With reference to FIG. 6, a Fresnel lens 600 may be employed to achieve the purposes of the invention. The Fresnel lens 600 may focus all the electromagnetic energy onto a target device 610 such as a solar cell that efficiently handles blue and red wavelengths. Part of the light may be focused on a part of the target device 620 that handles blue wavelengths and another part of the light on part of the target device 630 that handles red wavelengths. Note that other wavelengths could be used with the lower wavelengths being focused past the blue wavelengths in an area 640 and wavelengths higher than red being focused past the red wavelengths in an area 650.

Since the angle at which the refracted light impinges upon the target device 610 is critical for maximum efficiency and a slight difference in the angle would make a big difference in the concentration of the refracted rays a detector 700 utilizing the difference in the angle may be provided as shown in FIG. 7. Electromagnetic radiation 710 may enter a concentrating refracting lens 720 and be refracted and concentrated onto a target element 730. The refracted and concentrated rays may be in phase, as in band 740 and out of phase as in bands 750 and 760 with the target element 730. Detector 700 may be operable to determine if a system including the concentrating refracting lens 720 and the target element 730 is optimally focused by comparing the appropriate wavelengths for band 740 with the appropriate wavelengths for band 750 and the appropriate wavelengths for band 740 with the appropriate wavelengths for band 760. If band 740 has a higher concentration of the appropriate wavelengths, then the system is in focus. If bands 750 or 760 have a higher concentration of the appropriate wavelengths, then the system needs to be moved to get refocused. As shown in FIG. 7, the blue and red light is in focus for band 760 and out of focus for band 740. For optimal efficiency, the system may be moved to get refocused. Focusing bands 740, 750, and 760 may be on the target element 730 or apart from the target element 730.

An exemplary embodiment illustrating the principles of the invention is shown in FIG. 8. A concentrating refracting lens is shown with two regions. A first region 800 has a glass angle 820 of 16.9°. If the index of refraction for the red light ($I_{Red}$) is 1.75 and the index of refraction for the blue light ($I_{Blue}$) is 1.84, then the sunlight 830 will enter the lens and the red light 840 will exit the lens at Arcsine(sine(16.9°)*$I_{Red}$)=30.5° relative to the normal. The blue light 850 will exit the lens at Arcsine(sine(16.9°)*$I_{Blue}$)=32.2° relative to the normal. To determine the angle of the glass for a second region 810, the red light at the section bordering the first region 800 needs be the same as the angle of the blue light or 32.2°. Given this angle, the angle of the glass for the second region of glass 860 can be determined by the formula Arcsine (sine(32.2°)/$I_{Red}$)=17.76°. Given the angle of the glass of the second region 860, the blue light coming out of the second region 860 will be Arcsine(sine(17.76°)*$I_{Blue}$)= 34.14°

The preferred embodiment of the present invention may be modified in a number of ways without departing from the object of the invention. The number, size, shape, relative position, and composition of the concentrating refracting lens and target element may be varied. Within the concentrating refracting lens itself, different regions may have different compositions. Moreover, known techniques from the field of solar energy conversion may be applied in realizing the invention. For example, refracting or reflecting optical elements may be placed near the regions of focus to provide additional concentration, and photovoltaic cells may be stacked. Embodiments of the invention may include solar energy converters other than solar cells that also benefit from spectrum splitting, such as photo-electrochemical cells. The target element may also include an electromagnetic detector, which can determine if there are enough electromagnetic waves of a specific frequency to trigger the device to a specific level.

In addition to solar energy conversion, the present invention is of value for measurement of the spectral composition of electromagnetic radiation by placing detection means at the regions of focus. Additionally, the present invention may be used for educational demonstrations or decorative displays by making the regions of focus visible to an observer.

The present invention is generally advantageous for solar application in that concentration permits the use of a smaller quantity of relatively costly photovoltaic cells, and spectrum splitting allows those cells to operate at higher efficiency. The concentrating refracting lens of the invention can be economically manufactured of durable materials using methods known from Fresnel lens manufacture, although the concentrating refracting lens may be produced using other methods.

The system may take advantage of this by incorporating auto-focusing bands that take advantage of the concentration or lack of concentration of a specific wavelength at a specific band on the target element, or in conjunction with the target element. If the system is not in focus, then the system may be moved to regain maximum focus. The auto-focusing bans may also potentially be used with a device other than the concentrating refracting lens.

I claim:

1. A single lens for refracting and concentrating electromagnetic energy having a broad energy spectrum comprising:
    a lens having a planar flat side and a plurality of regions, each of the plurality of regions having a different angle relative to the planar flat side, each of the plurality of regions refracting the electromagnetic energy, and the plurality of regions concentrating specific wavelengths that form rectilinear bands on a target device.

2. The device according to claim 1, wherein the lens is a Fresnel lens.

3. The device according to claim 1, further comprising a focusing detector, the focusing detector operable to detect a condition where the concentrated specific wavelengths are in an in focus/out of focus condition relative to specific bands of the target device.

4. The device according to claim 3, wherein the focusing detector is part of the target device.

5. The device according to claim 3, wherein the focusing detector compares a first set of concentrated specific wavelengths in a first band of the target device with a second set of concentrated specific wavelengths in a second band of the target device and determines that the first set of concentrated specific wavelengths is out of focus relative to the first band of the target device.

* * * * *